United States Patent
No

(10) Patent No.: US 10,417,145 B2
(45) Date of Patent: Sep. 17, 2019

(54) MEMORY SYSTEM INCLUDING A PLURALITY OF MEMORY DEVICES HAVING DIFFERENT LATENCIES AND OPERATION METHOD THEREOF

(71) Applicant: SK hynix Inc., Gyeonggi-do (KR)

(72) Inventor: Su-Hyuck No, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 40 days.

(21) Appl. No.: 15/655,177

(22) Filed: Jul. 20, 2017

(65) Prior Publication Data
US 2018/0189200 A1 Jul. 5, 2018

(30) Foreign Application Priority Data
Dec. 30, 2016 (KR) .................. 10-2016-0184094

(51) Int. Cl.
*G06F 13/16* (2006.01)
*G06F 13/40* (2006.01)
*G11C 15/04* (2006.01)
*G11C 8/18* (2006.01)
*G11C 5/06* (2006.01)

(52) U.S. Cl.
CPC ........ *G06F 13/161* (2013.01); *G06F 13/1657* (2013.01); *G06F 13/1694* (2013.01); *G06F 13/404* (2013.01); *G11C 5/066* (2013.01); *G11C 8/18* (2013.01); *G11C 15/046* (2013.01); *G11C 2207/10* (2013.01); *G11C 2207/2272* (2013.01)

(58) Field of Classification Search
CPC .. G06F 13/161; G06F 13/404; G06F 13/1694; G06F 13/1657; G11C 5/066; G11C 15/046; G11C 8/18; G11C 2207/10; G11C 2207/2272
See application file for complete search history.

(56) References Cited

U.S. PATENT DOCUMENTS

| | | | | |
|---|---|---|---|---|
| 6,564,287 B1* | 5/2003 | Lee | ....................... | G11C 7/1018 365/233.18 |
| 2001/0038106 A1* | 11/2001 | Coteus | ................. | G11C 7/1051 257/200 |
| 2004/0003192 A1* | 1/2004 | Qawami | ............... | G06F 13/161 711/167 |
| 2008/0002484 A1* | 1/2008 | Cho | ..................... | G11C 7/1066 365/189.12 |
| 2011/0225445 A1* | 9/2011 | Gower | .................... | G06F 12/00 713/600 |
| 2015/0370731 A1* | 12/2015 | Yoon | .................... | G06F 13/1626 711/105 |
| 2017/0093400 A1* | 3/2017 | Bains | ....................... | G06F 3/061 |

FOREIGN PATENT DOCUMENTS

| KR | 1020120005548 | 1/2012 |
|---|---|---|
| KR | 1020150017948 | 2/2015 |

* cited by examiner

*Primary Examiner* — Tasnima Matin
(74) *Attorney, Agent, or Firm* — IP & T Group LLP

(57) ABSTRACT

A memory system includes memory devices sharing a data bus and a control bus and controlling the memory devices through the control bus, wherein the memory devices have different latencies each other, and a controller transceiving a data with the memory devices through the data bus, wherein the controller may transceive a data with the memory devices during a time corresponding to a data burst length for a moment being the each latencies of the memory devices after transmitting same control signals to the memory devices.

20 Claims, 7 Drawing Sheets

MEMORY SYSTEM INCLUDING A PLURALITY OF MEMORY DEVICES HAVING DIFFERENT LATENCIES AND OPERATION METHOD THEREOF

CROSS-REFERENCE TO RELATED APPLICATIONS

The present application claims priority of Korean Patent Application No. 10-2016-0184094, filed on Dec. 30, 2016, which is incorporated herein by reference in its entirety.

BACKGROUND

1. Field

Various embodiments of the present invention relate to a semiconductor design technology and, more particularly, to a memory system.

2. Description of the Related Art

Generally, a controller may be coupled with one or more memory devices. That is, a memory system may include a single controller which may be coupled to a plurality of memory devices.

FIG. 1(a) illustrate a conventional bus connection between a controller and two memory devices.

FIG. 1(a), shows memory device 110_0 coupled to a memory controller 100 via first control bus CMD/ADDR_BUS0 and first data bus DATA_BUS0, and a second memory device 110_1 coupled to the controller 100 via second control bus CMD/ADDR_BUS1 and second data bus DATA_BUS1. The controller 100 may control the memory devices 110_0 and 110_1. For example, the memory device 110_1 may perform a write operation while the memory device 110_0 may perform a read operation.

As shown in FIG. 1(b), when the memory devices 110_0 and 110_1 share a control bus CMD/ADDR_BUS and a data bus DATA_BUS, the controller 100 may respectively control the memory devices 110_0 and 110_1 only with signals CS0 and CS1 for selecting the memory devices 110_0 and 110_1. In this case, a memory device selected by one of the signals CS0 and CS1 may perform an operation in response to a command transferred by control bus CMD/ADDR_BUS and exchange signals with the controller 100 through the data bus DATA_BUS. Although the signals CS0 and CS1 belong to the command signals transferred by the control bus CMD/ADDR_BUS, the signals CS0 and CS1 are separately illustrated in FIG. 1 since they are separately assigned to the respective memory devices 110_0 and 110_1 differently from other command signals transferred by the control bus CMD/ADDR_BUS.

The size of data that can be transferred between a controller and the memory devices is fixed. When the raw bit error rate (RBER) is large in a memory system, the size of data that need to be error-corrected may increase for improving the error-correction capability of the memory system. In order to increase the size of data to be error-corrected, a controller may increase the number of commands applied to the memory devices or the size of the data bus of the memory system.

However, increasing the number of commands applied to memory devices may be concerned because the number of times, the controller must issue scheduling commands, may also increase. Also, Increasing the size of the data bus of the memory system may require significant and costly changes in the memory system design and manufacturing cost increases.

SUMMARY

Various embodiments of the present invention are directed to a memory system capable of transferring between a controller and memory devices data of increased size in response to a single command without an increase in a number of lines between the controller and the memory devices or in a number of commands provided by the controller to the memory devices.

In accordance with an embodiment of the present invention, a memory system includes: memory devices suitable for sharing a common data bus and a common control bus, wherein the memory devices each have different latencies; and a controller suitable for controlling memory devices and transceiving a data with the memory devices through the data bus, wherein the controller may respectively transceive a data with the memory devices during time corresponding to data burst length BL from a moment being the each latencies of the memory devices after transmitting same signals to the memory devices.

Preferably, the latency may include an Additive Latency AL, and each of the Additive Latencies AL of the memory devices is set to a time interval corresponding to the data burst length BL.

Preferably, the shortest Additive Latency AL may be 0.

Preferably, the control signal may be a write command.

Preferably, the controller may transmit a date corresponding to the write command to the memory devices during time corresponding to the data burst length BL from a moment being each latency of the memory devices after transmitting the write command to the memory devices.

Preferably, the latency may include the Additive Length AL and Cas Write Latency CWL.

Preferably, the control signal may be a read command.

Preferably, the controller may receive a data corresponding to the read command from the memory devices during time corresponding to the data burst length BL from a moment when the latency of each of the memory devices passes after transmitting the read command to the memory devices.

Preferably, the latency may include the Additive Latency AL and Cas Write Latency CWL.

Preferably, the control signal may include a chip selection signal CS command signals and address signals.

In accordance with an embodiment of the present invention, a method for operating a memory system includes: transmitting, by the controller, a same write command to the memory devices; transmitting a data corresponding to the write command to the memory devices during a time corresponding to a data burst length BL from a moment being the each latencies of the memory devices after transmitting the write command to the memory devices by the controller; wherein each latency of the memory devices may be different each other.

Preferably, the latency may include an Additive Latency, and the operation method of the memory system may further include setting, by the controller, each Additive Length AL of the memory devices to a time interval corresponding to a data burst length BL Preferably, the shortest Additive Latency AL may be 0 among an Additive Latency AL of the memory devices.

Preferably, the latency may include the Additive Latency AL and a Cas Write Latency CWL.

In accordance with an embodiment of the present invention, a method for operating a memory system includes: transmitting, by the controller, a same read command to the memory devices, wherein the memory devices may have different latency each other; receiving a data corresponding to the read command from the memory devices during a time corresponding to a data burst length BL from a moment being each latency of the memory devices after transmitting the read command to the memory devices by the controller.

Preferably, the latency may include an Additive Latency, and the operation method of the memory system may further include setting, by the controller, each Additive Length AL of the memory devices to a time interval corresponding to a data burst length BL Preferably, the shortest Additive Latency AL may be 0 among an Additive Latency AL of the memory devices.

Preferably, the latency may include the Additive Latency AL and Cas Write Latency CWL.

Preferably, the read command may include a chip selection signal CS command signals and address signals.

DETAILED DESCRIPTION

Figure 1:
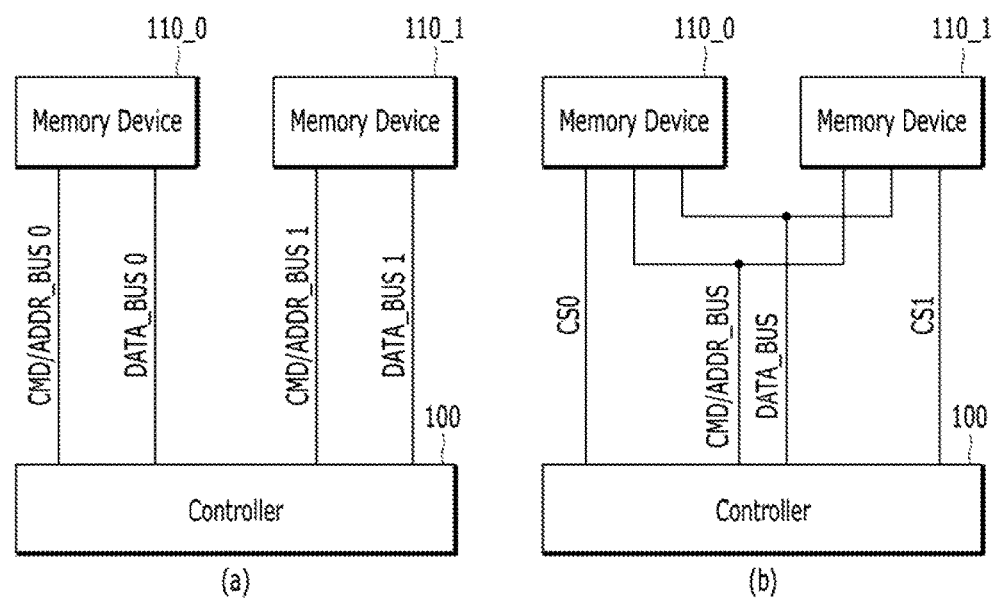
FIG. 1 is block diagram illustrating conventional bus connections between a controller and memory devices.

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have other elements as well as those elements if there is no specific limitation. The terms of singular form may include plural forms unless stated otherwise.

Figure 2:
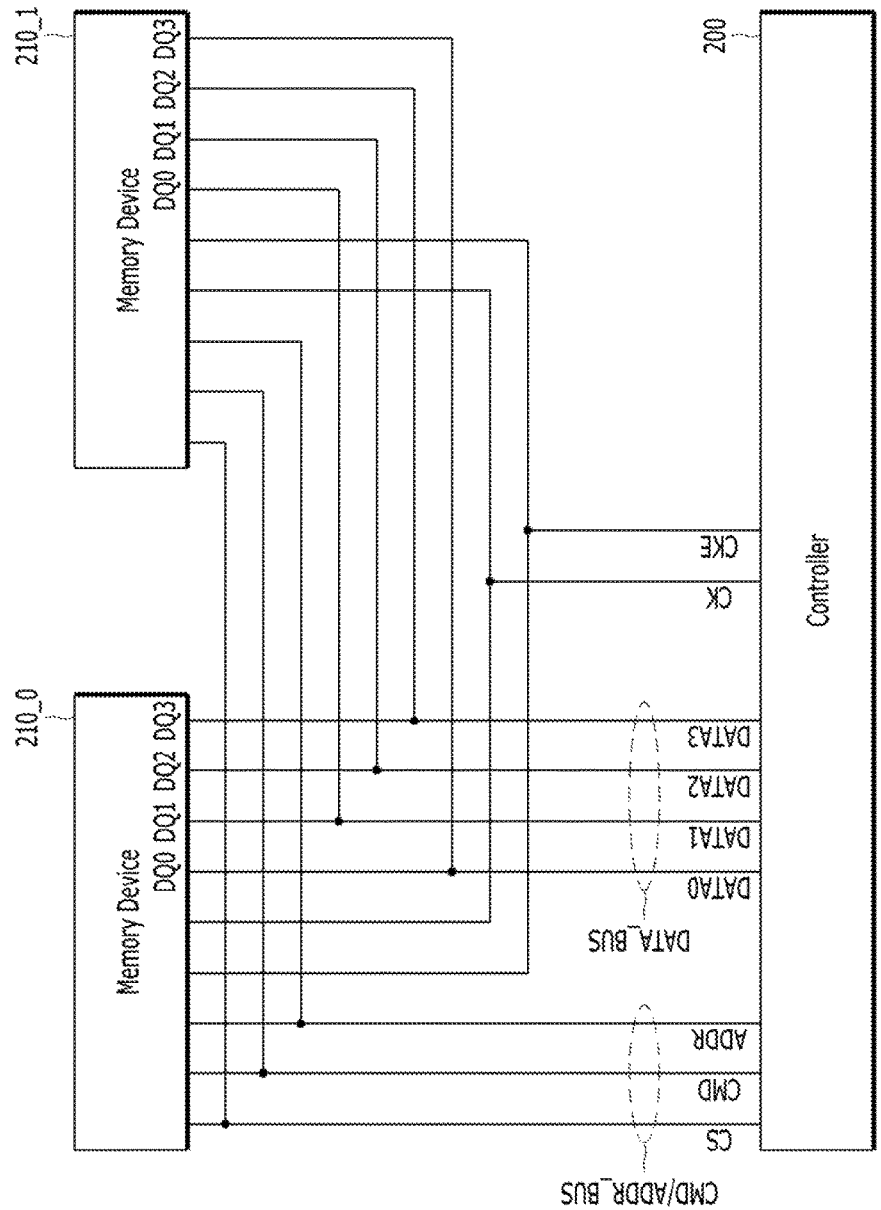
FIG. 2 is a block diagram illustrating a memory system in accordance with an embodiment of the present invention.

FIG. 2 is a block diagram illustrating a memory system in accordance with an embodiment of the present invention.

Referring to FIG. 2, a memory system may include a controller 200, a first memory device 210_0, a second memory device 210_1, a control bus CMD/ADDR_BUS and a data bus DATA_BUS. The memory system may further include a line for transmitting a clock CK and a line for transmitting a clock enable signal CKE directing a moment when the memory devices 210_0 and 210_1 have to operate in synchronization with the clock CK.

The controller 200 may transmit a control signal to the memory devices 210_0 and 210_1 through a control bus CMD/ADDR_BUS. Control signals may include commands CMD and addresses ADDR. The commands CMD may include a plurality of signals. For example, the commands may include an active signal ACT, a row address strobe signal RAS, a column address strobe signal CAS and a chip selection signal CS. Although the chip selection signal CS is included in the commands CMD, it is separately illustrated in the drawing to show that the memory devices 210_0 and 210_1 share the same chip selection signal CS with each other. The addresses ADDR may include a plurality of signals. For example, the addresses ADDR may include a multi-bit bank group address, a multi-bit bank address and a multi-bit normal address.

The controller 200 may transceive multi-bit data with the memory devices 210_0 and 210_1 through a data bus DATA_BUS. Data lines DATA0 to DATA3 of the data bus DATA_BUS may be respectively coupled with data pads DQ0 to DQ3. Data pads DQ0 to DQ3 may be included in the memory devices 210_0 and 210_1. For example, the data pad DQ0 of the first and second memory devices 210_0 and 210_1 may be coupled with different data lines DATA0 and DATA1. The data pad DQ0 may be used for a control signal CMD/ADDR transferred through the control bus CMD/ADDR_BUS.

The controller 200 may provide the clock CK to the memory devices 210_0 and 210_1 for synchronized operation of memory devices 201_0 and 210_1. The controller 200 may provide the clock CK and a complementary clock to memory devices 210_0 and 210_1 in a differential way. The controller 200 may provide the clock enable signal CKE to the memory devices 210_0 and 210_1. The clock enable signal CKE may notify the memory devices 210_0 and 210_1 when to start to operate for synchronization with the clock CK.

The controller 200 may be included in a processor such as a central processing unit (CPU), graphic processing unit (GPU) and application processor (AP) and may be included in a memory module such as dual in-line memory module (DIMM). Also, the controller 200 may be formed in various ways. For example, the controller 200 may be included in a separate chip in a system including a memory device, such as, a computing device, a mobile phone, etc. The controller 200 may control the memory devices 210_0 and 210_1 through the control bus CMD/ADDR_BUS and may exchange data with the memory devices 210_0 and 210_1 through the data bus DATA_BUS.

The controller 200 may set through the control bus CMD/ADDR_BUS a CAS write latency CWL indicating when to provide data to the memory devices 210_0 and 210_1 and a CAS latency CL indicating when to receive data read from the memory devices 210_0 and 210_1 and an additive latency AL indicating different moments of providing and receiving data to and from the memory devices 210_0 and 210_1. The controller 200 may transceive data with the memory devices 210_0 and 210_1 at different moments according to the set latencies CWL, CL and AL.

The first memory device 210_0 and the second memory device 210_1 may share the control bus CMD/ADDR_BUS and the data bus DATA_BUS with each other. The first memory device 210_0 and the second memory device 210_1 may share chip selection signal CS with each other. The first memory device 210_0 and the second memory device 210_1 may transceive data with controller 200 at different moments by differently set values of the additive latency AL for the respective first and second memory devices 210_0 and 210_1.

Figure 3:
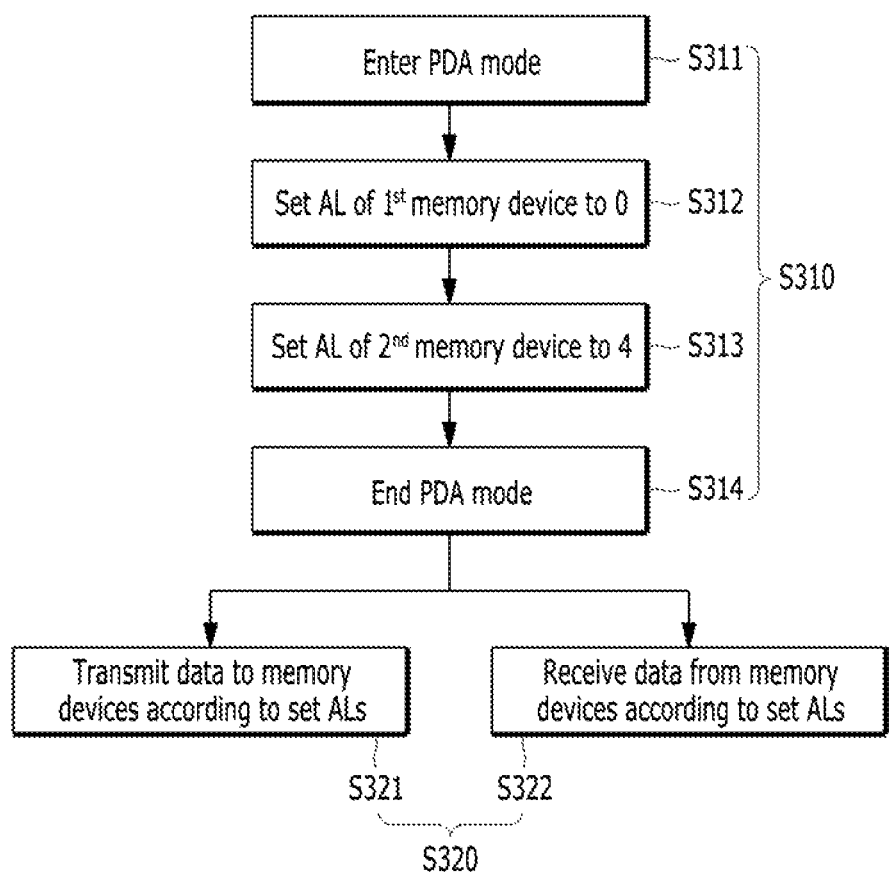
FIG. 3 is a flowchart illustrating an operation of the memory system shown in FIG. 2.

FIG. 3 is a flowchart illustrating an operation of a memory system shown in FIG. 2.

Figure 4:
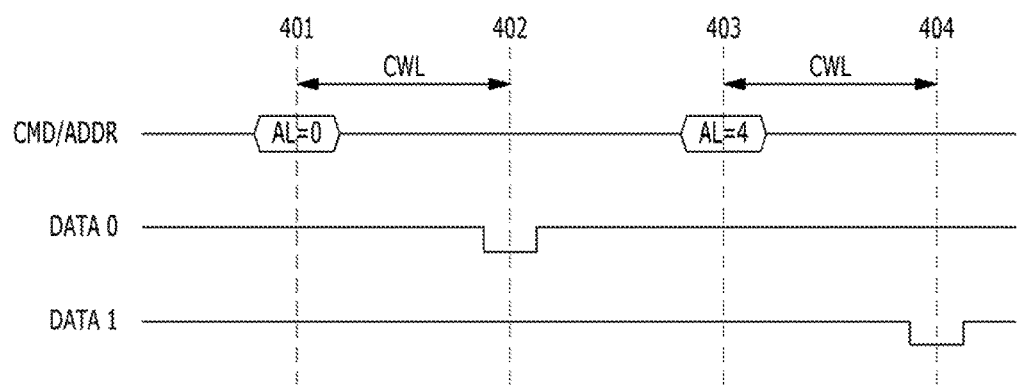
FIG. 4 is a timing diagram illustrating steps shown in FIG. 3.

FIG. 4 is timing diagram illustrating steps S312 and S313 of FIG. 3.

Referring to FIG. 3, the operation of the memory system may be divided into step S310 for setting the additive latency AL for the controller 200 to transceive data with the memory devices 210_0 and 210_1 at different moments, and step S320 for the controller 200 to transceive data with the first memory device 210_0 and the second memory device 210_1 at the different moments according to the set additive latency AL.

At step S310, the controller 200 may set the additive latency AL for each of the memory devices 210_0 and 210_1 so that the difference between the additive latency AL of the memory devices 210_0 and 210_1 is equal to the number of clocks corresponding to a preset data burst length BL. For example, when a memory system is operated at a double data rate (DDR) and the data burst length BL is '8', the number of clocks corresponding to the data burst length may be '4' and thus the controller 200 may set the additive latency AL of the first memory device 210_0 to '0' and the additive latency AL of the second memory device 210_1 to '4'. As a result, the controller 200 may set the additive latencies ALs of the memory devices 210_0 and 210_1 so that difference between the additive latencies ALs of the memory devices 210_0 and 210_1 is equal to the number of clocks corresponding to the data burst length BL. It is assumed below that the memory system operates at the DDR and the data burst length BL is '8'.

At step S311, the controller 200 may apply the control signal CMD/ADDR for the first and second memory devices 210_0 and 210_1 to enter a Per DRAM Accessibility (PDA) mode. Specifically, the controller 200 may apply a combination of the commands CMD corresponding to the mode register set (MRS) and a combination of the addresses ADDR corresponding to the entry to the PDA mode.

At step S312, the controller 200 may set the additive latency AL of the first memory device 210_0 to '0'. Specifically, the controller 200 may apply a combination of the commands CMD corresponding to the MRS and a combination of the addresses ADDR corresponding to setting of the additive latency AL to '0'. After a CAS write latency CWL elapses from a moment when the combination of the commands CMD are applied, the controller 200 may apply a signal of a logic '0' level to the $0^{th}$ data line DATA0 corresponding to the $0^{th}$ data pad DQ0 of the first memory device 210_0. Referring to FIG. 4, the control signals CMD/ADDR for setting the additive latency AL to '0' may be applied at a moment 401, and the data line DATA0 may have a logic '0' level and the data line DATA1 may have a logic '1' level at a moment 402 when a CAS write latency CWL passes from a moment 401. As a result, the additive latency AL of the first memory device 210_0 may be set to have a value of '0' and the second memory device 210_1 may ignore the control signals CMD/ADDR applied at the moment 401.

At step S313, the controller 200 may set the additive latency AL of the second memory device 210_1 to '4'. Specifically, the controller 200 may apply a combination of the commands CMD corresponding to the MRS and a combination of the addresses ADDR corresponding to the setting of the additive latency AL to '4'. After a CAS write latency CWL elapses from a moment when the combination of the commands CMD are applied, the controller 200 may apply a signal of a logic '0' level to the $0^{th}$ data line DATA1 corresponding to the $0^{th}$ data pad DQ0 of the second memory device 210_1. Referring to FIG. 4, the control signals CMD/ADDR for setting the additive latency AL to '4' may be applied at a moment 403, and the data line DATA0 may have a logic '1' level and the data line DATA1 may have a logic '0' level a moment 404 when a CAS write latency CWL passes from a moment 403. As a result, the additive latency AL of the second memory device 210_1 may be set to have a value of '4' and the first memory device 210_1 may ignore the control signals CMD/ADDR applied at the moment 403.

When the controller 200 completes the setting of the additive latencies ALs of the memory devices 210_0 and 210_1, the controller 200 may close PDA mode at step S314.

Since the additive latencies ALs of the first memory device 210_0 and the second memory device 210_1 are set to have different values from each other, the controller 200 may transceive data with the first memory device 210_0 and the second memory device 210_1 at different moments by applying a single control signal CMD/ADDR. Specifically, when the controller 200 enables a chip selection signal CS and applies the control signals CMD/ADDR, the controller 200 may transceive data with the memory devices 210_0 and 210_1 during the clocks, that is 4 clocks corresponding to the data burst length BL after sum of the additive latency AL and the preset CAS write latency CWL or the preset CAS latency CL (i.e., AL+CWL or AL+CL) from a moment when the control signals CMD/ADDR is applied.

Figure 5:
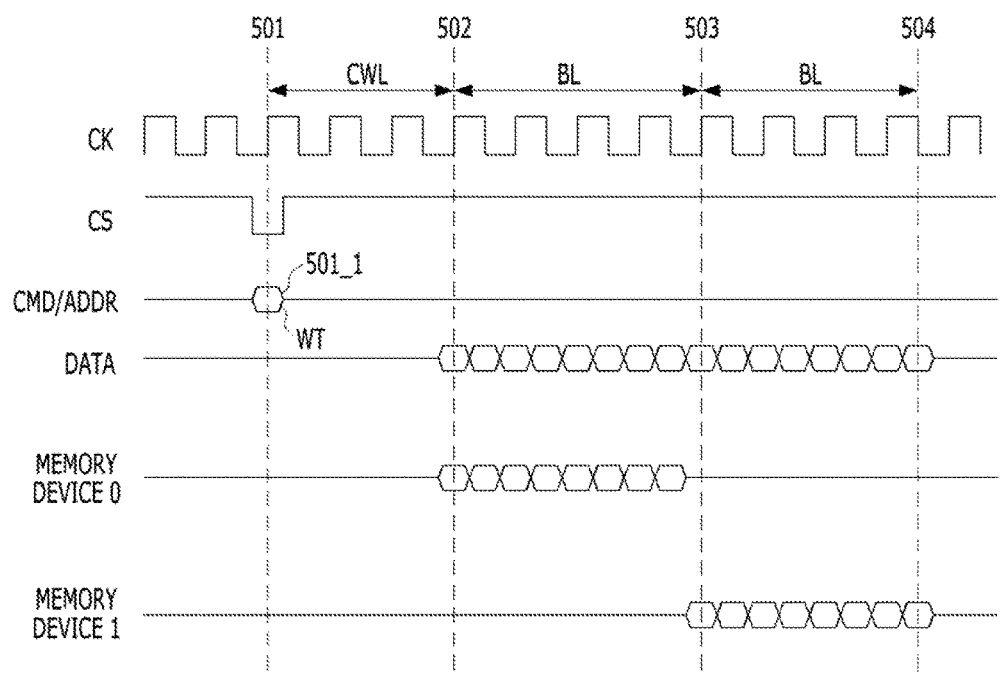
FIG. 5 is a timing diagram illustrating steps shown in FIG. 3.

FIG. 5 is a timing diagram illustrating step S321 shown in FIG. 3.

Referring to FIGS. 4 and 5, at step S321, the first memory device 210_0 and the second memory device 210_1 may identify the control signals CMD/ADDR corresponding to the write command WT 501_1 applied at a moment 501 when the chip selection signal CS is enabled. And then, the controller 200 may provide data corresponding to the write command WT 501_1 through the data bus DATA_BUS during clocks corresponding to twice of the data burst length BL, that is, 8 clocks (i.e., moments 502 to 504) from a moment 502 when the preset CAS write latency CWL passes from the moment 501 of the write command WT 501_1. The first memory device 201_0 may identify data applied through the data bus DATA_BUS during clocks corresponding to the data burst length BL, that is, 4 clocks (i.e., period from moment 502 to moment 503) from a moment 502 when sum of the preset CAS write latency CWL and the additive latency AL (=0) of the first memory device 210_0 passes from the moment 501 of the write command WT 501_1. The second memory device 201_1 may identify data applied through the data bus DATA_BUS during clocks corresponding to the data burst length BL, that is, 4 clocks (i.e., moments 503 to 504) from a moment 503 when the sum of the preset CAS write latency CWL and the additive latency AL (=4) of the second memory device 210_1 passes from a moment 501 of the write command WT 501_1.

Figure 6:
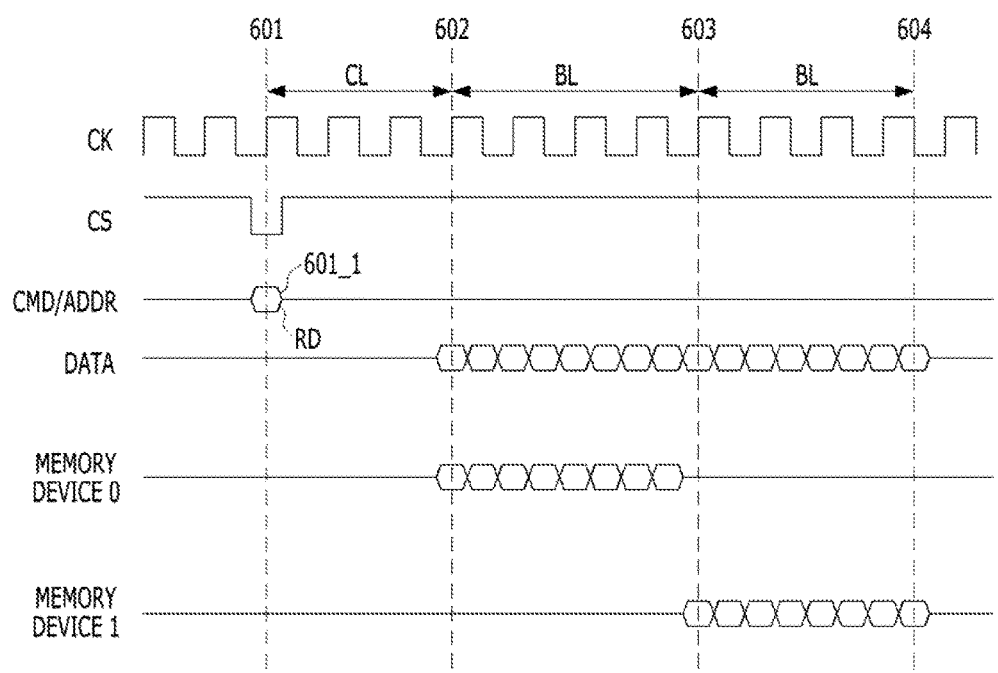
FIG. 6 is a timing diagram illustrating steps shown in FIG. 3.

FIG. 6 is a timing diagram illustrating step S322 shown in FIG. 3.

Referring to FIGS. 4 and 6, at step S322, the first memory device 210_0 and the second memory device 210_1 may identify the control signals CMD/ADDR corresponding to the read command RD 601_1 applied at a moment 601 when the chip selection signal CS is enabled. And then, the first memory device 210_0 may provide data corresponding to the read command RD 601_1 through the data bus DATA_BUS during clocks corresponding to the data burst length BL, that is, 4 clocks (i.e., period from moment 602 to moment 603) from the moment 602 when the sum of the preset CAS latency CL and the additive latency AL (=0) of the first memory device 210_0 passes from the moment 601 of read command RD 601_1. The second memory device 201_1 may identify data applied through the data bus DATA_BUS during clocks corresponding to the data burst length BL, that is, 4 clocks (i.e., period from moment 603 to moment 604) from a moment 603 when the sum of the preset CAS latency CL and the additive latency AL (=4) of the second memory device 210_1 passes from the moment 601 of the read command RD 601_1. The controller 200 may receive data applied through the data bus DATA_BUS from the memory devices 210_0 and 210_1 during clocks corresponding to twice of the data burst length BL, that is, 8 clocks (i.e., moments 602 to 604) from the moment 602 when the preset CAS latency CL passes from the moment 601 of the read command RD 601_1.

In accordance with the embodiments of the present invention described with reference to FIGS. 2 to 6, although the memory devices 210_0 and 210_1 share the control bus CMD/ADDR_BUS and the data bus DATA_BUS, they have different additive latencies ALs from each other for the data bus DATA_BUS. Therefore, the controller 200 may read or write data corresponding to twice of the data burst length BL from or to the memory devices 210_0 and 210_1 by single read command or single write command applied to the control bus CMD/ADDR_BUS.

Also, when the controller 200 reads or writes data corresponding to twice of original data size by single read command or single write command, the size of data to be error-corrected may be doubled. As a result, a memory system with a great raw bit error rate (BRER) may improve error correction capability by additively assigning a parity bit.

Also, when the controller 200 reads or writes data corresponding to twice of original data size by single read command or single write command, the number of times for scheduling commands may be reduced.

Although it is described in the embodiments that the memory devices 210_0 and 210_1 are set by the controller 200 to have different latencies for the data bus DATA_BUS, the inventive concept is not limited to this. For example, in an embodiment of the present invention, the memory devices 210_0 and 210_1 may be programmed to permanently have different latencies. For example, the latencies for the data bus DATA_BUS may be fixed when the memory devices 210_0 and 210_1 are fabricated, or through permanent setting through a fuse circuit after the memory devices 210_0 and 210_1 are fabricated.

Figure 7:
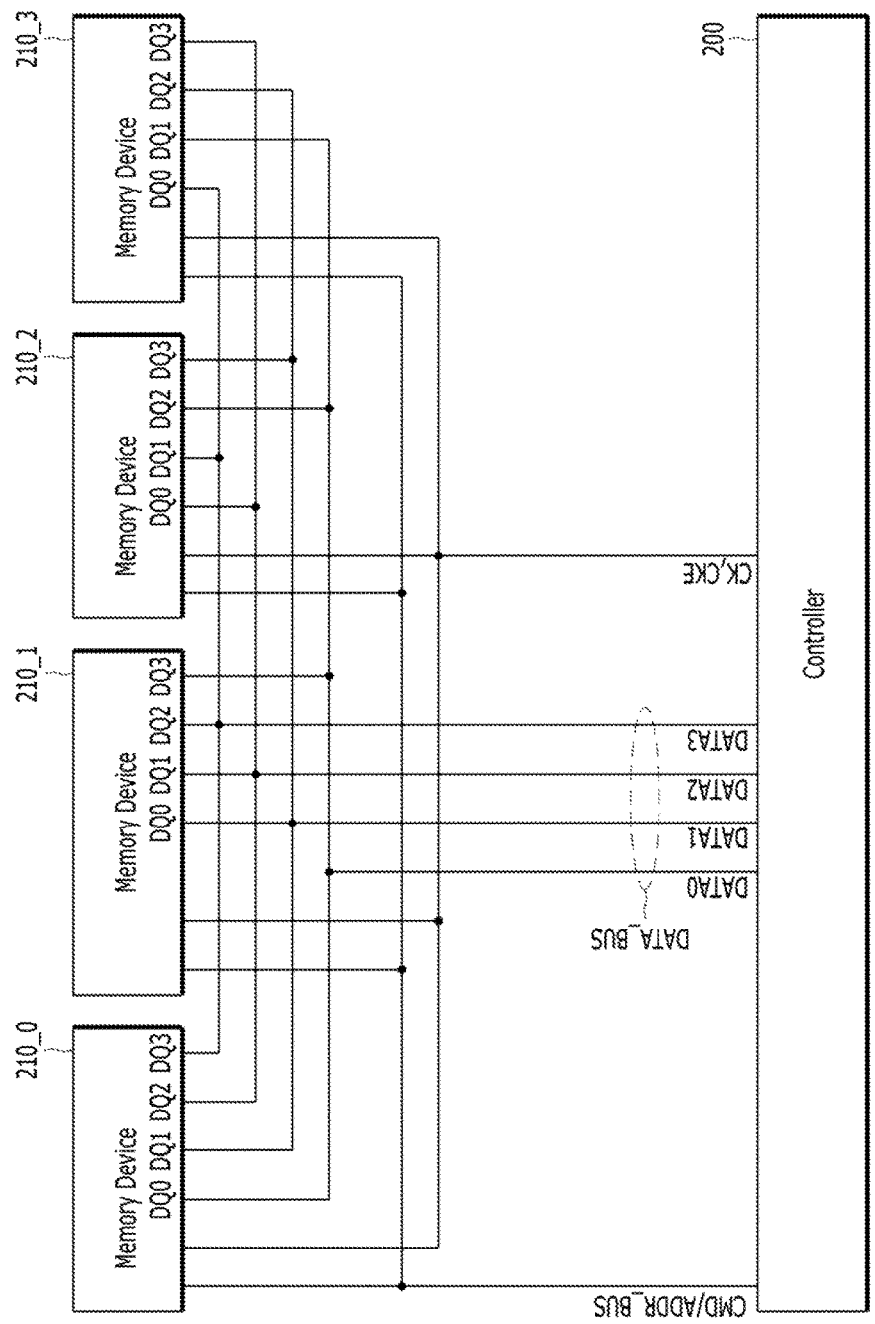
FIG. 7 is a block diagram illustrating a memory system in accordance with an embodiment of the present invention.

FIG. 7 is a block diagram illustrating a memory system in accordance with another embodiment of the present invention. FIG. 7 illustrates a simplified control bus CMD/ADDR_BUS and a transmission line for clock CK and clock enable signal CKE having the same coupling relationship as shown in FIG. 2.

In the embodiment of FIG. 7, memory devices 210_2 and 210_3 are added as compared with the embodiment of FIG. 2. The added memory devices 210_2 and 210_3 may also share the control bus CMD/ADDR_BUS and the data bus DATA_BUS with each other. Different data lines DATA0 to DATA3 for the memory devices 210_0 to 210_3 may be coupled with a predetermined data pad DQ0 for setting a latency.

In the memory system shown in FIG. 7 similar to the memory system shown in FIG. 2, the controller 200 may set an additive latency AL for each the memory devices 210_0 to 210_3 in the PDA mode. And the controller 200 may set the additive latencies ALs of the memory devices 210_0 to 210_3 to be different from each other. At this time, the controller 200 may set the additive latencies ALs of the memory devices 210_0 to 210_3 such to increase in a step-wise manner from an initial value of zero for the first memory device adding a time interval at each step corresponding to the time required for processing a data burst length BL and thus differences among the additive latencies ALs of the memory devices 210_0 to 210_3 correspond to integer multiples of clocks corresponding to the data burst length BL. For example, when the data burst length BL is "4" clocks, the additive latency AL of the first memory device 210_0 is '0' clock, the additive latency AL of the second memory device 210_1 is '4' clocks, the additive latency AL of the third memory device 210_2 is '8' clocks, and the additive latency AL of the fourth memory device 210_3 is '12' clocks. As a result, the controller 200 may read or write data corresponding to quadruple of the data burst length from or to the memory devices 210_0 to 210_3 by a single read command or single write command.

Although various embodiments have been described for illustrative purposes, it will be apparent to those skilled in the art that various changes and modifications may be made without departing from the spirit and scope of the invention as defined in the following claims.

What is claimed is:

1. A memory system, comprising:
a plurality of memory devices sharing a common data bus and a common control bus; and
a controller suitable for:
controlling the memory devices and transceiving data with the memory devices through the common data bus;
setting latencies for the plurality of memory devices using additive latencies, each of the additive latencies corresponding to each of the memory devices; and
transceiving data with the memory devices, respectively, in response to a single control signal, during clock intervals, wherein each of the clock intervals is corresponding to a data burst length based on a corresponding set latency among the set latencies.

2. The memory system of claim 1,
wherein the controller further sets the additive latencies to have values increasing by a time interval corresponding to the data burst length.

3. The memory system of claim 2, wherein the smallest value of the additive latencies is 0.

4. The memory system of claim 3, wherein the control signal is a write command.

5. The memory system of claim 4, wherein the controller transmits data corresponding to the write command to each of the memory devices during a clock interval corresponding to the data burst length based on the corresponding latency among the set latencies, in response to the write command.

6. The memory system of claim 5, each of the latencies further includes a CAS write latency.

7. The memory system of claim 3, wherein the control signal is a read command.

8. The memory system of claim 7, wherein the controller receives data corresponding to the read command from each of the memory devices during a clock interval corresponding to the data burst length based on the corresponding latency among the set latencies, in response to the read command.

9. The memory system of claim 8, wherein each of the latencies further includes a CAS latency.

10. The memory system of claim 3, wherein the control signal includes chip selection signal, command signal and address signal.

11. A method for operating a memory system including a plurality of memory devices, the method comprising:
transmitting a single write command to the memory devices;
setting latencies for the plurality of memory devices using additive latencies, each of the additive latencies corresponding to each of the memory devices; and
transmitting data corresponding to the write command to each of the memory devices, respectively, in response to the write command, during clock intervals, wherein each of the clock intervals is corresponding to a data burst length based on a corresponding set latency among the set latencies.

12. The method of claim 11,
further comprising setting the additive latencies to have values increasing by a time interval corresponding to the data burst length.

13. The method of claim 12, wherein the smallest value of the additive latencies is 0.

14. The method of claim 13, each of the latencies further includes and a CAS write latency.

15. The method of claim 13, wherein the write command includes chip selection signal, command signal and address signal.

16. A method for operating a memory system including a plurality of memory devices, the method comprising:
transmitting a single read command to the memory devices;
setting latencies for the plurality of memory devices using additive latencies, each of the additive latencies corresponding to each of the memory devices; and
receiving data corresponding to the read command from the memory devices, respectively, in response to the read command, during clock intervals, wherein each of the clock intervals is corresponding to a data burst length based on a corresponding set latency among the set latencies.

17. The method of claim 16,
further comprising setting the additive latencies to have values increasing by a time interval corresponding to the data burst length.

18. The method of claim 17, wherein the smallest value of the additive latencies is 0.

19. The method of claim 18, wherein each of the latencies further includes and a CAS latency.

20. The method of claim 18, wherein the read command includes chip selection signal, command signal and address signal.

* * * * *